(12) United States Patent
Ji et al.

(10) Patent No.: US 12,219,728 B2
(45) Date of Patent: Feb. 4, 2025

(54) PCB ASSEMBLY

(71) Applicant: KMW INC., Hwaseong-si (KR)

(72) Inventors: Kyo Sung Ji, Hwaseong-si (KR); Chi Back Ryu, Hwaseong-si (KR); Bae Mook Jeong, Suwon-si (KR); Min Seon Yun, Anyang-si (KR)

(73) Assignee: KMW INC., Hwaseong-si (KR)

( * ) Notice: Subject to any disclaimer, the term of this patent is extended or adjusted under 35 U.S.C. 154(b) by 112 days.

(21) Appl. No.: 17/994,017

(22) Filed: Nov. 25, 2022

(65) Prior Publication Data

US 2023/0090243 A1    Mar. 23, 2023

Related U.S. Application Data

(63) Continuation of application No. PCT/KR2021/006513, filed on May 25, 2021.

(30) Foreign Application Priority Data

May 26, 2020    (KR) .......................... 10-2020-0063074

(51) Int. Cl.
*H05K 7/14*    (2006.01)
(52) U.S. Cl.
CPC .................................. *H05K 7/1439* (2013.01)
(58) Field of Classification Search
CPC ............................. H05K 1/141; H05K 7/1439
See application file for complete search history.

(56) References Cited

U.S. PATENT DOCUMENTS

| | | | |
|---|---|---|---|
| 6,377,471 B1 * | 4/2002 | Chong, Jr. ........... | G11B 33/126 439/62 |
| 8,345,439 B1 * | 1/2013 | Goergen .............. | H05K 7/1458 361/792 |

(Continued)

FOREIGN PATENT DOCUMENTS

| | | | |
|---|---|---|---|
| DE | 102010028990 A1 * | 12/2011 | .......... H01R 12/737 |
| JP | 49-143755 U | 4/1973 | |

(Continued)

OTHER PUBLICATIONS

English Translation DE-202010017834-U1 (Year: 2011).*

(Continued)

*Primary Examiner* — Nathan Milakovich
(74) *Attorney, Agent, or Firm* — Insight Law Group, PLLC; Seung Lee

(57) ABSTRACT

A PCB assembly is disclosed herein. An embodiment of the present disclosure provides a printed circuit board (PCB) assembly on which a plurality of devices is mounted, including: a power supply area disposed at one side of a main printed circuit board; a first area positioned in another direction of the main printed circuit board from the power supply area and including the plurality of devices; a second area positioned in another direction of the main printed circuit board from the first area and including the plurality of devices; a third area positioned in another direction of the main printed circuit board from the second area and including the plurality of devices; and a bridge printed circuit board receiving power from the power supply area and disposed vertically to the main printed circuit board, wherein the bridge printed circuit board crosses the first area, the second area, and the third area, and transmits power and a signal to at least one area.

11 Claims, 6 Drawing Sheets

(56) References Cited

U.S. PATENT DOCUMENTS

| | | | |
|---|---|---|---|
| 2003/0150642 | A1 | 8/2003 | Wu et al. |
| 2012/0167386 | A1 | 7/2012 | Goergen et al. |
| 2013/0342968 | A1* | 12/2013 | Peterson ............... H05K 1/141 |
| | | | 361/679.01 |
| 2020/0337169 | A1* | 10/2020 | Jank ....................... H05K 7/10 |

FOREIGN PATENT DOCUMENTS

| | | |
|---|---|---|
| JP | 1990-081077 U | 6/1990 |
| JP | 10-200229 A | 7/1998 |
| JP | 2010-010600 A | 1/2010 |
| KR | 10-2017-0066083 A | 6/2017 |
| KR | 10-2020-0049620 A | 5/2020 |
| WO | 2014-160356 A1 | 10/2014 |

OTHER PUBLICATIONS

Non-final Office Action mailed on Jan. 9, 2024 from the Japanese Patent Office for Japanese Application No. 2022-572318 and its English translation.

International Search Report mailed Aug. 30, 2021 for International Application No. PCT/KR2021/006513 and its English translation.

Non-final Office Action mailed on Oct. 18, 2024 from the Korean Patent Office for Korean Application No. 10-2020-0063074 and its English translation.

* cited by examiner

PCB ASSEMBLY

CROSS-REFERENCE TO RELATED APPLICATION

This application is a continuation application of International Application No. PCT/KR2021/006513, filed May 25, 2021, which claims priority to Patent Application No. 10-2020-0063074, filed on May 26, 2020 in Korea, the entire contents of which are incorporated herein by reference.

TECHNICAL FIELD

The present disclosure relates to a PCB assembly. More particularly, the present disclosure relates to a PCB assembly capable of detouring various electrical signals.

BACKGROUND ART

Contents described in the present section merely provide background information on the present disclosure and do not constitute the related art.

In a printed circuit board (PCB), multiple electronic components are disposed, and each component transmits and receives an electrical signal. However, when the quantity of transmitted and received electrical signals increases or the signal should be processed at a high speed, a phenomenon in which a signal processing speed becomes slow occurs, and this causes performance deterioration of the PCB.

In order to resolve the decrease in signal processing speed, a method such as expanding a receiving capacity of the component by increasing the number of layers of the PCB, etc., is used. However, when the quality of the signal signals processed by the component is large or a high-speed signal is processed, the number of layers of the PCB should be multiple layers, for example, 20 layers or more. Therefore, various technical difficulties should be solved in order to manufacture the PCB, and as a result, significant cost is required.

SUMMARY

Therefore, the present disclosure is directed to solve the problems, and a main object of the present disclosure is to provide a PCB assembly capable of detouring an electrical signal in order to solve a decrease problem in signal processing speed without an increase in number of layers of a PCB.

To achieve such objectives, an embodiment of the present disclosure is directed to providing a printed circuit board (PCB) assembly on which a plurality of devices is mounted, including: a power supply area disposed at one side of a main printed circuit board; a first area positioned in another direction of the main printed circuit board from the power supply area and including the plurality of devices; a second area positioned in another direction of the main printed circuit board from the first area and including the plurality of devices; a third area positioned in another direction of the main printed circuit board from the second area and including the plurality of devices; and a bridge printed circuit board receiving power from the power supply area and disposed vertically to the main printed circuit board, wherein the bridge printed circuit board crosses the first area, the second area, and the third area, and transmits power and a signal to at least one area.

As described above, according to the exemplary embodiment, it is possible to prevent a bottleneck phenomenon from occurring without increasing the number of layers of a PCB, i.e., while reducing manufacturing cost, by detouring various electrical signals.

REFERENCE NUMERALS

Figure 1:
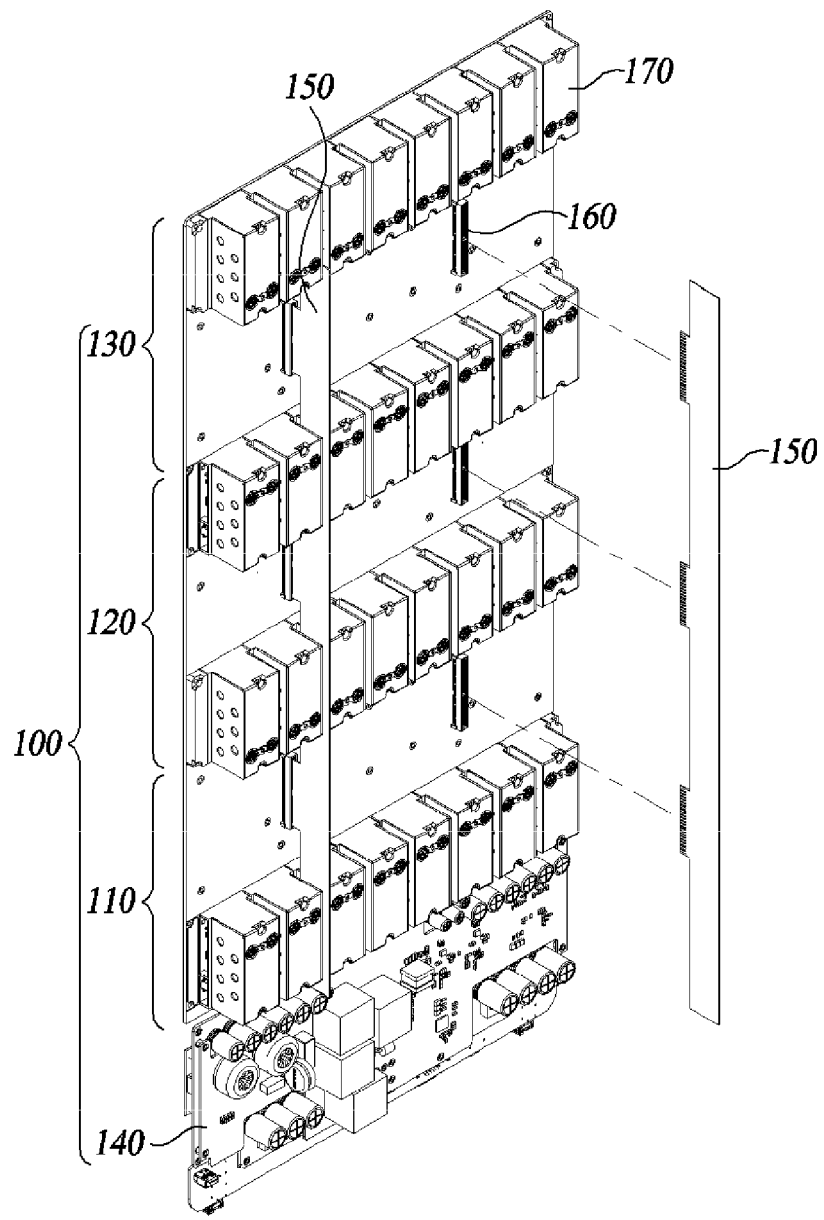
FIG. 1 is a perspective view of a PCB assembly according to an exemplary embodiment of the present disclosure.

100: main printed circuit board
110: first area
120: second area
130: third area
140: power supply area
150: bridge printed circuit board
160: card connector
170: filters
300: plurality of devices
310: main device
320: sub device
400: plurality of power supply bars

DESCRIPTION OF EXEMPLARY EMBODIMENTS

Hereinafter, some exemplary embodiments of the present disclosure will be described in detail with reference to the accompanying drawings. In the following description, like reference numerals preferably designate like elements, although the elements are shown in different drawings. Furthermore, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout the present specification, when a part 'includes' or 'comprises' a component, the part is meant to further include other components, not to exclude thereof unless specifically stated to the contrary.

FIG. 1 is a perspective view of a PCB assembly according to an exemplary embodiment of the present disclosure.

Figure 2:
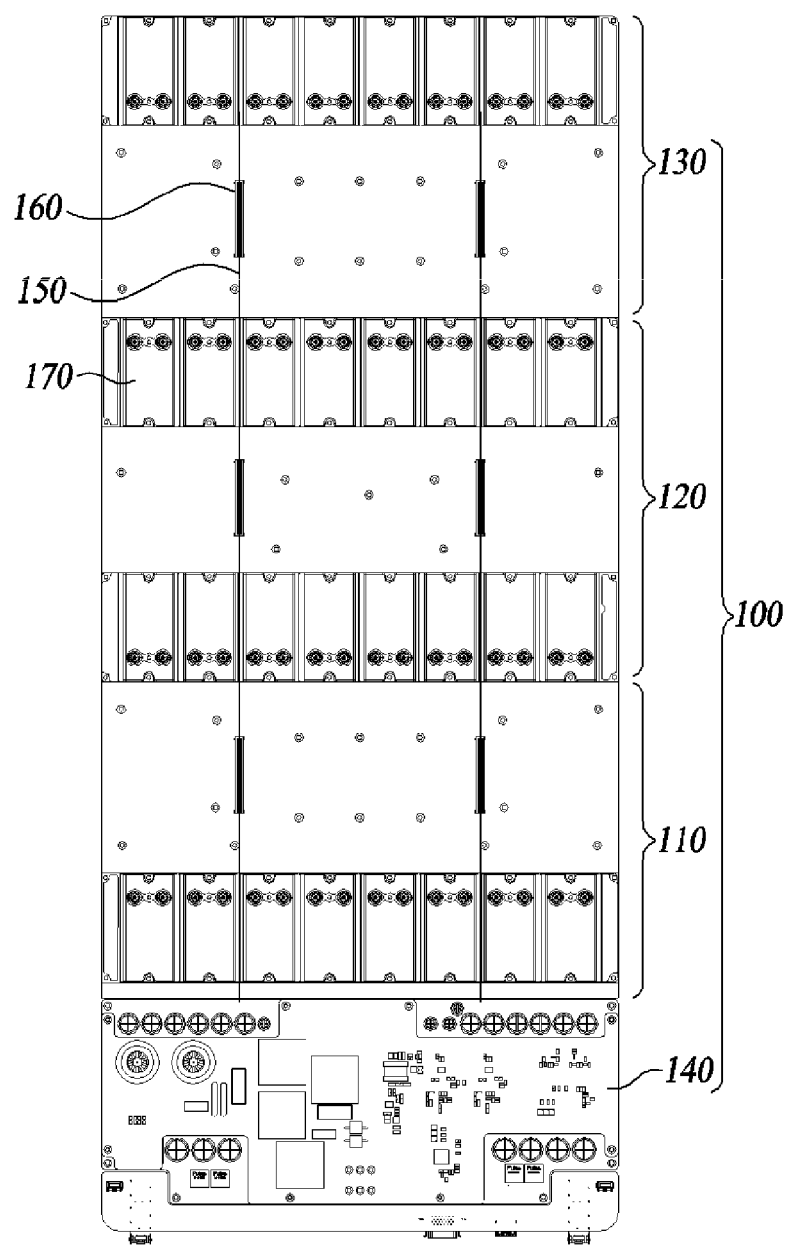
FIG. 2 is a top view of the PCB assembly according to an exemplary embodiment of the present disclosure.

FIG. 2 is a top view of the PCB assembly according to an exemplary embodiment of the present disclosure.

Figure 3:
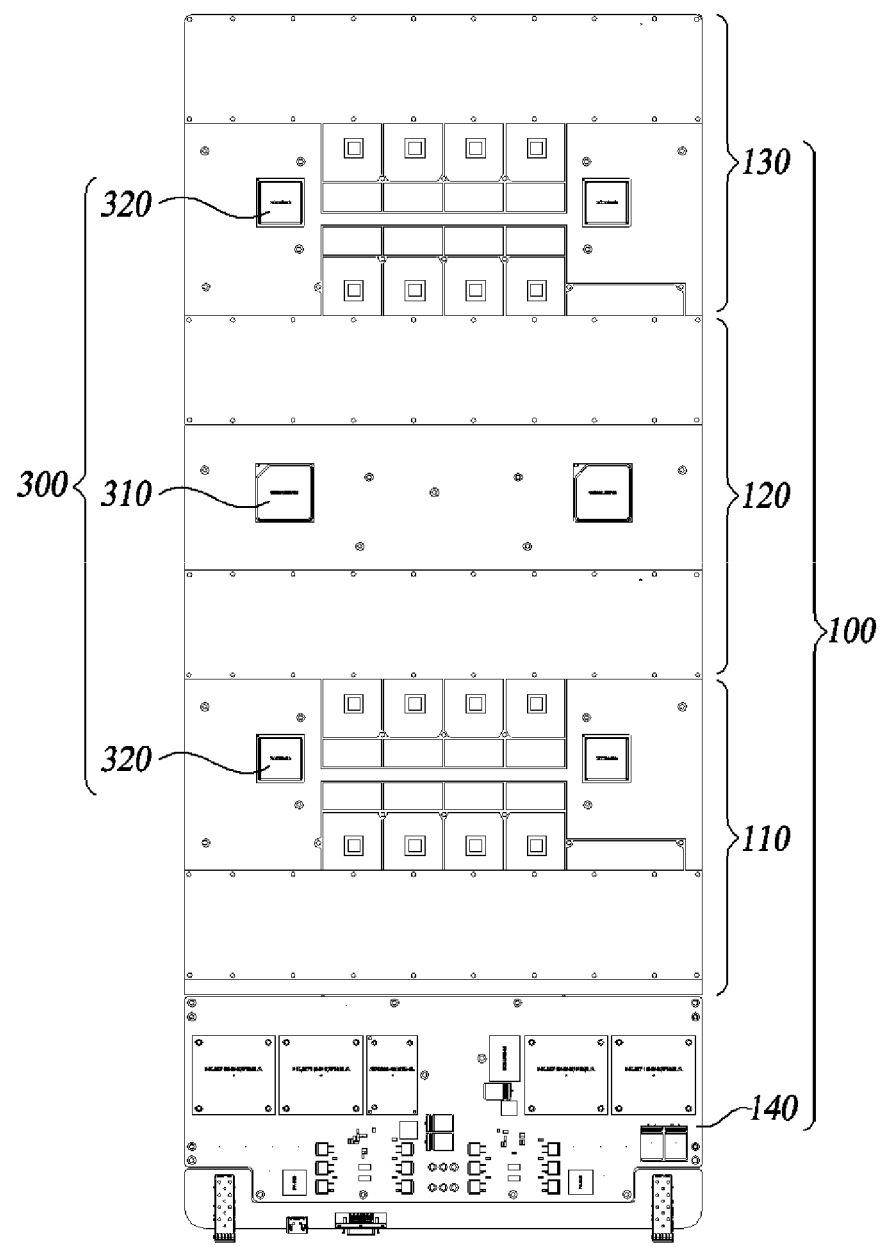
FIG. 3 is a bottom view of the PCB assembly according to an exemplary embodiment of the present disclosure.

FIG. 3 is a bottom view of the PCB assembly according to an exemplary embodiment of the present disclosure.

Referring to FIGS. 1 to 3, the PCB assembly according to an exemplary embodiment of the present disclosure includes all or some of a main printed circuit board 100, a power supply area 140, a first area 110, a second area 120, a third area 130, a bridge printed circuit board 150, a plurality of filters 170, and a card connector 160.

The main printed circuit board 100 may have a plurality of devices mounted thereon. The main printed circuit board 100 according to an exemplary embodiment of the present disclosure may be, for example, a board used in a communication antenna system, but is not particularly limited thereto.

The power supply area 140 may be disposed at one side of the main printed circuit board 100. The power supply area 140 is configured to serve to supply power to the main printed circuit board 100 and to supply different voltages according to needs of the devices mounted on the main printed circuit board 100. The power supply area 140 according to an exemplary embodiment of the present disclosure supplies DC power.

The first area 110 is positioned in a direction of the other side of the main printed circuit board 100 from the power supply area 140. That is, the power supply area 140 and the first area 110 are positioned in order with respect to one side of the main printed circuit board 100. The first area 110 may include a plurality of devices 300. The plurality of devices 300 may be, for example, Field-Programmable Gate Array (FPGA) or Application-Specific Integrated Circuit (ASIC), but is not particularly limited thereto.

The second area 120 is positioned in a direction of the other side of the main printed circuit board 100 from the first area 110. That is, the power supply area 140, the first area 110, and the second area 120 are positioned in order with respect to one side of the main printed circuit board 100. The second area 120 may also include the plurality of devices 300. The plurality of devices 300 may be, for example, FPGA or ASIC, but is not particularly limited thereto.

The third area 130 is positioned in a direction of the other side of the main printed circuit board 100 from the second area 120. That is, the power supply area 140, the first area 110, the second area 120, and the third area 130 are positioned in order with respect to one side of the main printed circuit board 100. The third area 130 may also include the plurality of devices 300. The plurality of devices 300 may be, for example, FPGA or ASIC, but is not particularly limited thereto.

The bridge printed circuit board 150 may be disposed vertically to the main printed circuit board 100, and may receive the power from the power supply area 140. The bridge printed circuit board 150 may cross the first area 110, the second area 120, and the third area 130, and transmit the power and the high-speed signal to at least one area.

When the bridge printed circuit board 150 is used, for example, in a case where the power needs to be supplied to the third area 130, the power may not pass through the first area 110 and the second area 120, so a separate power connection line may not be disposed in the main printed circuit board 100.

The number of bridge printed circuit boards 150 disposed in the main printed circuit board 100 may be one or a plurality, and the plurality of devices may be mounted on the bridge printed circuit board 150.

The plurality of filters 170 may be positioned at an area adjacent to at least one side of the first area 110, the second area 120, and the third area 130. The plurality of filters 170 extracts a signal in a specific frequency band. An amplifier may be positioned at a lower end of the plurality of filters 170.

When the plurality of filters 170 is disposed in the main printed circuit board 100, the plurality of filters 170 may be disposed in line with the bridge printed circuit board 150. That is, the plurality of filters 170 may be disposed in line with the direction in which the signal is transmitted in the bridge printed circuit board 150.

When the bridge printed circuit board 150 and the plurality of filters 170 are disposed in line, the plurality of filters 170 may be disposed to be spaced apart from both surfaces of the bridge printed circuit board 150.

The card connector 160 is mounted on at least one of the first area 110, the second area 120, and the third area 130, and is configured to be coupled to the bridge printed circuit board 150. For example, the first area 110, the second area 120, and the third area 130 may each have one card connector 160 mounted thereon. Furthermore, the card connector 160 is configured for the bridge printed circuit board 150 to be removable.

When the card connector 160 is mounted, it is electrically connected to the plurality of devices 300 disposed on one surface of each of the first area 110, the second area 120, and the third area 130. Furthermore, when the bridge printed circuit board 150 is coupled to the card connector 160, the card connector 160 and the bridge printed circuit board 150 are also electrically connected. Therefore, the bridge printed circuit board 150 is electrically connected to the plurality of devices 300 by the card connector 160.

The PCB assembly according to an exemplary embodiment of the present disclosure may further include other area (not illustrated).

The other area is included in the main printed circuit board 100, and is positioned in the other direction of the main printed circuit board 100 from the third area 130, and includes the plurality of devices. That is, a separate device is disposed on one surface of the other area to perform a separate function.

When the main printed circuit board 100 includes the other area, the bridge printed circuit board 150 may cross the first area, 110, the second area 120, the third area 130, and the other area, and transmit the power and the signal to at least one area.

The PCB assembly according to an exemplary embodiment of the present disclosure may include all or some of a main device 310 and a sub device 320.

For example, the main device 310 may be disposed on one surface of the second area 120 and the sub device 320 may be disposed on one surface of each of the first area 110 and the third area 130.

The main device 310 performs an operation by receiving the digital signal, and then transmits the digital signal according to an operation result to the sub device 320 by using the bridge printed circuit board 150. The signal transmitted by the main device 310 may be a data signal, a control signal, etc.

The sub device 320 may perform the operation by receiving the signal from the main device 310 and control the plurality of devices. For example, the sub device 320 may control a plurality of radio frequency integrated circuits (RFICs) disposed in the main printed circuit board 100.

The signals from the main device 310 and the sub device 320 may be transmitted by using the bridge printed circuit board 150. Therefore, it is possible to transmit the signal between the devices without passing through the main printed circuit board 100 by using the bridge printed circuit board. For example, the main device 310 and the sub device 320 may be mounted on the main printed circuit board 100 by using 100 or more signal transmission pins. In this case, when all signals are transmitted by using the main printed circuit board 100, the signal processing speed of the device may be lowered, so it is preferable to transmit at least some signals by using the bridge printed circuit board 150.

One or a plurality of main devices 310 and sub devices 320 may be disposed in each of the first area 110, the second area 120, and the third area 130.

The PCB assembly according to an exemplary embodiment of the present disclosure, by including all or some of the abovementioned configurations, may detour the main printed circuit board 100 to transmit the signals to the plurality of devices 300. Therefore, there is an effect that a speed lowering phenomenon of the signal may be prevented.

Figure 4:
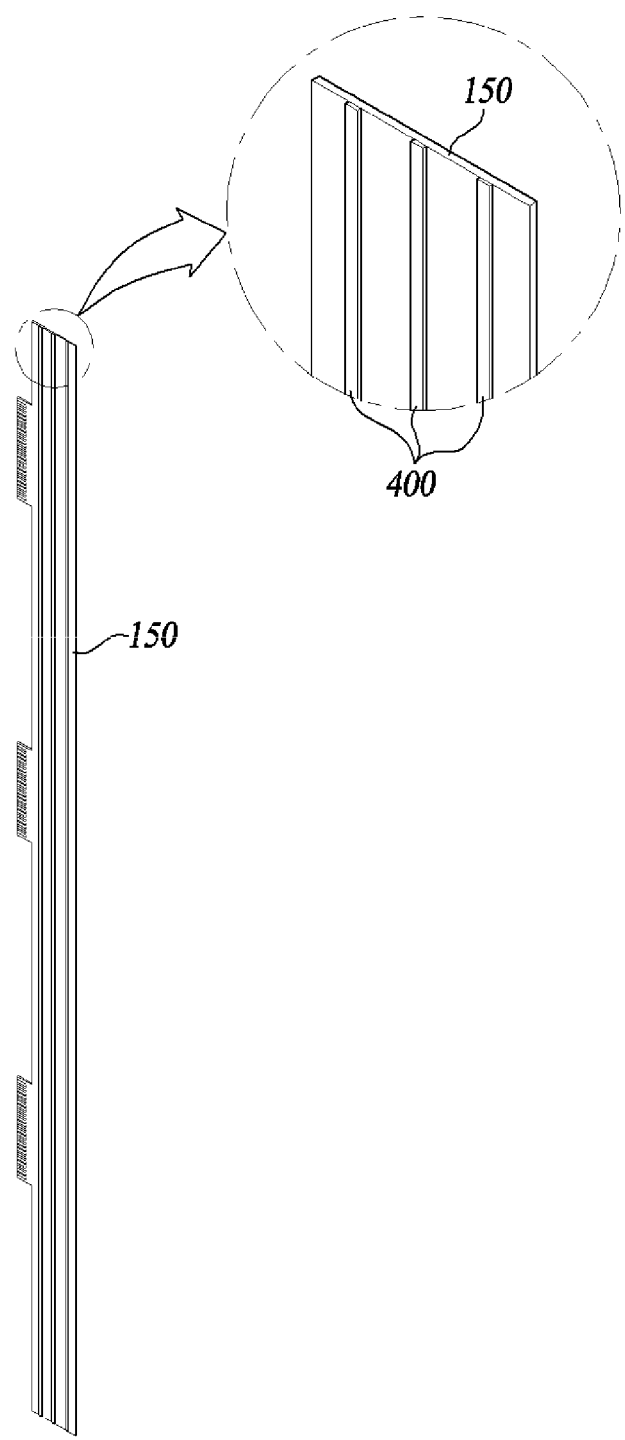
FIG. 4 is an exploded perspective view illustrating one surface of a bridge printed circuit board according to an exemplary embodiment of the present disclosure.

FIG. 4 is an exploded perspective view illustrating one surface of a bridge printed circuit board according to an exemplary embodiment of the present disclosure.

Referring to FIG. 4, the PCB assembly according to an exemplary embodiment of the present disclosure may include a plurality of power supply bars 400. The plurality of power supply bars 400 illustrated in FIG. 4 is expressed to be protruded slightly exaggeratedly for the description, and is not particularly limited to such a shape.

The plurality of power supply bars 400 is mounted on at least one surface of the bridge printed circuit board 150. That is, the plurality of power supply bars 400 may be mounted on both surfaces of the bridge printed circuit board 150, and the number of mounted power supply bars is also changeable as necessary.

The plurality of power supply bars 400 may distribute the power from the power supply area 140 to the first area 110, the second area 120, and the third area 130. Furthermore, the respective power supply bars 400 may each receive different voltages and distribute different voltages according to a need of each area.

The bridge printed circuit board 150 includes the plurality of power supply bars 400 to simplify a power supply line of the main printed circuit board 100.

Figure 5:
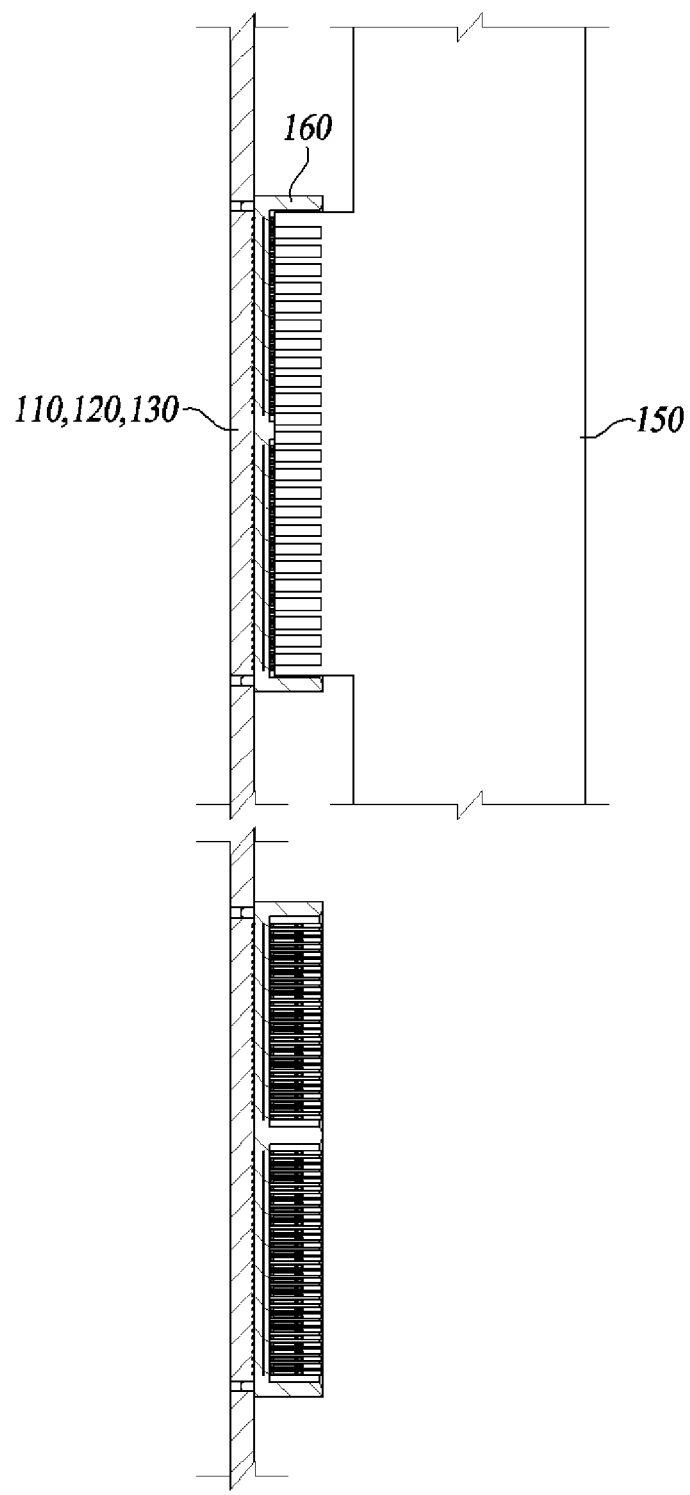
FIG. 5 is a cross-sectional view of the bridge printed circuit board and a card connector, which illustrates a case where the bridge printed circuit board is attached to and detached from the card connector according to an exemplary embodiment of the present disclosure.

FIG. 5 is a cross-sectional view of the bridge circuit board and a card connector, which illustrates a case where the bridge printed circuit board is attached to and detached from the card connector according to an exemplary embodiment of the present disclosure.

Figure 6:
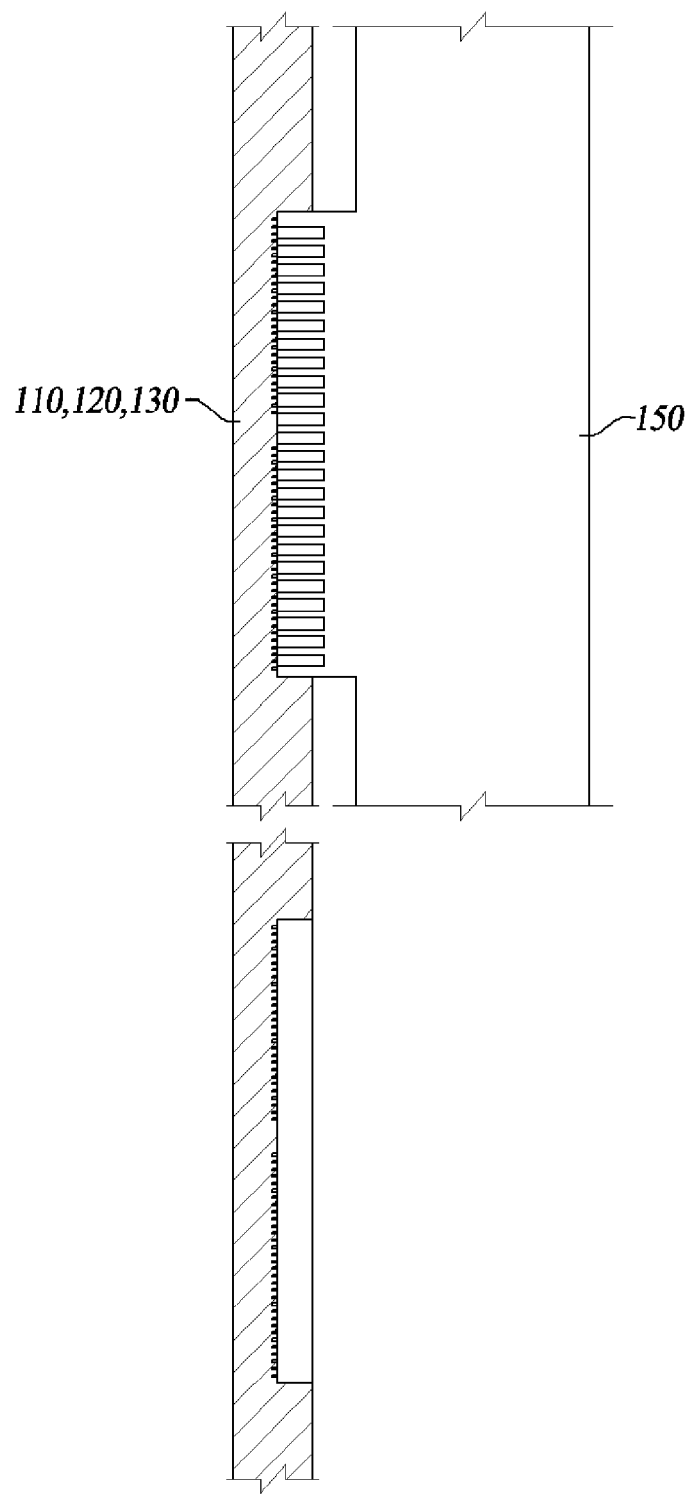
FIG. 6 is a cross-sectional view of a main bridge circuit board and the bridge printed circuit board, which illustrates a case where the bridge printed circuit board is soldered to the main printed circuit board according to an exemplary embodiment of the present disclosure.

FIG. 6 is a cross-sectional view of a main bridge circuit board and the bridge printed circuit board, which illustrates a case where the bridge printed circuit board is soldered to the main printed circuit board according to an exemplary embodiment of the present disclosure.

Referring to FIGS. 5 and 6, the bridge printed circuit board 150 according to an exemplary embodiment of the present disclosure may be connected to the card connector 160, and also directly soldered to the main printed circuit board 100.

When the bridge printed circuit board 150 is connected to the card connector 160, the bridge printed circuit board 150 is removably connected to the card connector 160. On one card connector 160, a portion where the bridge printed circuit board 150 is connected thereto may be constituted by a plurality of portions, and in this case, the bridge printed circuit board 150 is also configured to be inserted into a plurality of connection portions.

When the bridge printed circuit board 150 is directly soldered to the main printed circuit board 100, a groove capable of coupling the bridge printed circuit board 150 may be formed on one surface of the main printed circuit board 100. The bridge printed circuit board 150 may be soldered to the groove of the main printed circuit board 100 to be electrically connected to the plurality of devices 300.

The PCB assembly according to an exemplary embodiment of the present disclosure may further include a bridge cover (not illustrated) in order to prevent the bridge printed circuit board 150 from being separated from the main printed circuit board 100 or the card connector 160.

The bridge cover may be configured to be removable from the main printed circuit board 100 or the card connector 160, and may prevent the bridge printed circuit board 150 from being separated while covering the bridge printed circuit board 150. For example, the bridge cover may be configured in a 'c' shape, but is not particularly limited thereto.

As described above, the PCB assembly according to an exemplary embodiment of the present disclosure can prevent the signal processing speed from being lowered without increasing the number of layers of the PCB by detouring various electrical signals such as the power, the data signal, the control signal, etc., to not pass through the main printed circuit board 100.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. A printed circuit board (PCB) assembly on which a plurality of devices is mounted, comprising:
    a power supply area disposed on one side of a main printed circuit board;
    a first area positioned in another region of the one side of the main printed circuit board from the power supply area and including at least one of the plurality of devices;
    a second area positioned in another region of the one side of the main printed circuit board from the first area and including at least one of the plurality of devices;
    a third area positioned in another region of the one side of the main printed circuit board from the second area and including at least one of the plurality of devices; and
    a bridge printed circuit board receiving power from the power supply area and disposed vertically to the main printed circuit board,
    wherein the bridge printed circuit board crosses the first area, the second area, and the third area, and transmits power and a signal to at least one of the first, second, and third area.

2. The PCB assembly of claim 1, further comprising:
    a card connector mounted on at least one of the first area, the second area, and the third area, and configured to be coupled to the bridge printed circuit board.

3. The PCB assembly of claim 2, further comprising:
    a bridge cover configured to be removable from the main printed circuit board or the card connector, and prevent the bridge printed circuit board from being separated by covering the bridge printed circuit board.

4. The PCB assembly of claim 1, wherein a main device is disposed on one surface of the second area, a sub device is disposed on one surface of each of the first area and the third area, and the main device controls the sub devices.

5. The PCB assembly of claim 1, further comprising:

a plurality of filters positioned at one or more locations adjacent to at least one side of the first area, the second area, and the third area.

6. The PCB assembly of claim 5, wherein the plurality of filters is disposed in a direction which is in line with the bridge printed circuit board.

7. The PCB assembly of claim 6, wherein the plurality of filters is disposed to be spaced apart from both surfaces of the bridge printed circuit board.

8. The PCB assembly of claim 1, further comprising:

a plurality of power supply bars mounted on at least one surface of the bridge printed circuit board and supplying power of different voltages.

9. The PCB assembly of claim 1, wherein there is a plurality of bridge printed circuit boards.

10. The PCB assembly of claim 1, wherein the bridge printed circuit board is soldered to at least one of the first area, the second area, and the third area.

11. The PCB assembly of claim 1, further comprising an other area positioned in another region of the one side of the main printed circuit board from the third area, and further includes at least one of the plurality of devices, and the bridge printed circuit board crosses the first area, the second area, the third area, and the other area, and transmits the power and the signal to at least one area of the first second, third, and other area.

* * * * *